United States Patent
Sedighi (10) Patent No.: US 12,261,621 B2
(45) Date of Patent: Mar. 25, 2025

(54) SUCCESSIVE APPROXIMATION REGISTER (SAR) ANALOG-TO-DIGITAL CONVERTER (ADC) WITH INPUT-DEPENDENT LEAST SIGNIFICANT BIT (LSB) SIZE

(71) Applicant: QUALCOMM Incorporated, San Diego, CA (US)

(72) Inventor: Behnam Sedighi, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 268 days.

(21) Appl. No.: 17/949,149

(22) Filed: Sep. 20, 2022

(65) Prior Publication Data
US 2024/0097698 A1 Mar. 21, 2024

(51) Int. Cl.
| | | |
|---|---|---|
| H03M 1/46 | (2006.01) | |
| H03M 1/18 | (2006.01) | |
| H03M 1/36 | (2006.01) | |
| H03M 1/08 | (2006.01) | |
| H03M 1/12 | (2006.01) | |
| H03M 1/38 | (2006.01) | |

(52) U.S. Cl.
CPC ......... H03M 1/462 (2013.01); H03M 1/185 (2013.01); H03M 1/368 (2013.01); H03M 1/08 (2013.01); H03M 1/12 (2013.01); H03M 1/38 (2013.01)

(58) Field of Classification Search
CPC ...... H03M 1/462; H03M 1/185; H03M 1/368; H03M 1/08; H03M 1/38; H03M 1/12
See application file for complete search history.

(56) References Cited

U.S. PATENT DOCUMENTS

| | | | | |
|---|---|---|---|---|
| 9,425,814 B1* | 8/2016 | Verma | ............ | H03M 1/468 |
| 10,447,289 B1* | 10/2019 | Shikata | ............ | H03M 1/002 |
| 2009/0044230 A1* | 2/2009 | Oh | ............ | H04H 40/27 |
| | | | | 725/62 |

OTHER PUBLICATIONS

Saha A., et al., "A 100MS/s 9-bit Companding SAR ADC with On-Chip Input Driver in 65nm CMOS for Multi-Carrier Communications," 2018 IEEE 61st International Midwest Symposium on Circuits and Systems (MWSCAS), Aug. 2018, pp. 174-177.

* cited by examiner

*Primary Examiner* — Joseph J Lauture
(74) *Attorney, Agent, or Firm* — Patterson & Sheridan LLP (57) ABSTRACT

Techniques and apparatus for successive approximation register (SAR) analog-to-digital converters (ADCs) with variable resolution. One example SAR ADC is generally configured to convert an analog input signal to a digital output signal, wherein a quantization size of a least significant bit (LSB) associated with the digital output signal is configured to depend on an amplitude of the analog input signal. By utilizing the techniques and apparatus described herein, a SAR ADC may be capable of a higher maximum sampling rate or a lower power dissipation.

27 Claims, 6 Drawing Sheets

Convert an analog input signal to a digital output signal using a successive approximation register (SAR) analog-to-digital converter (ADC), wherein a quantization size of a LSB associated with the digital output signal depends on an amplitude of the analog input signal — 610

FIG. 6

SUCCESSIVE APPROXIMATION REGISTER (SAR) ANALOG-TO-DIGITAL CONVERTER (ADC) WITH INPUT-DEPENDENT LEAST SIGNIFICANT BIT (LSB) SIZE

FIELD OF THE DISCLOSURE

Certain aspects of the present disclosure generally relate to electronic components and, more particularly, to successive approximation register (SAR) analog-to-digital converters (ADCs) with a variable quantization size of a least significant bit (LSB).

BACKGROUND

An analog-to-digital converter (ADC) is an electronic circuit used to convert an analog signal to a digital signal, typically for performing signal processing in the digital domain. Several types of ADCs are available, each with varying advantages and disadvantages that make some ADC types more suitable for particular applications than others. For example, a successive approximation register (SAR) ADC may provide an area and power-efficient architecture for low-to-medium accuracy analog-to-digital conversion applications. A SAR ADC may use a digital-to-analog converter (DAC) and a comparator to approximate a digital value corresponding to an analog input. Another type of ADC referred to as a flash ADC may provide a faster conversion speed at the cost of an exponential increase in power and area consumption compared to a SAR ADC. Another type of ADC with faster sampling rates than SAR ADCs, but lower power and area consumption than flash ADCs is referred to as a pipelined ADC.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure provide a successive approximation register (SAR) analog-to-digital converter (ADC) circuit. The SAR ADC circuit is generally configured to convert an analog input signal to a digital output signal, wherein a quantization size of a least significant bit (LSB) associated with the digital output signal is configured to depend on an amplitude of the analog input signal.

Certain aspects of the present disclosure provide a SAR ADC circuit. The SAR ADC circuit generally includes a capacitive digital-to-analog converter (CDAC) comprising an array of switched capacitors, a comparator having an input coupled to an output of the CDAC, and logic having an input coupled to an output of the comparator. The SAR ADC circuit is generally configured such that two or more most significant bit (MSB) capacitors in the array of switched capacitors have a non-binary weighting, the logic has a first output with N bits for a digital output signal, the logic has a second output with two or more bits for controlling the two or more MSB capacitors based on one or more MSBs of the digital output signal, and remaining capacitors in the array of switched capacitors are configured to be controlled by at least a portion of remaining bits of the digital output signal.

Certain aspects of the present disclosure provide a method of signal conversion. The method generally includes converting an analog input signal to a digital output signal using a SAR ADC, wherein a quantization size of a LSB associated with the digital output signal depends on an amplitude of the analog input signal.

Certain aspects of the present disclosure provide an apparatus for signal conversion. The apparatus generally includes means for converting an analog input signal to a digital output signal, wherein a quantization size of a LSB associated with the digital output signal depends on an amplitude of the analog input signal.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to successive approximation register (SAR) analog-to-digital converters (ADCs) with variable resolution (and more particularly, with variable quantization size of a least significant bit (LSB)). The LSB size may depend on an amplitude of an analog signal input to the SAR ADC, with a larger LSB size for larger amplitude input signals. In this manner, a SAR ADC may make fewer comparisons than a conventional SAR ADC with a fixed LSB size, and thus, may be capable of a higher maximum sampling rate or a lower power dissipation.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Successive Approximation Register (SAR) Analog-to-Digital Converter (ADC)

Figure 1:
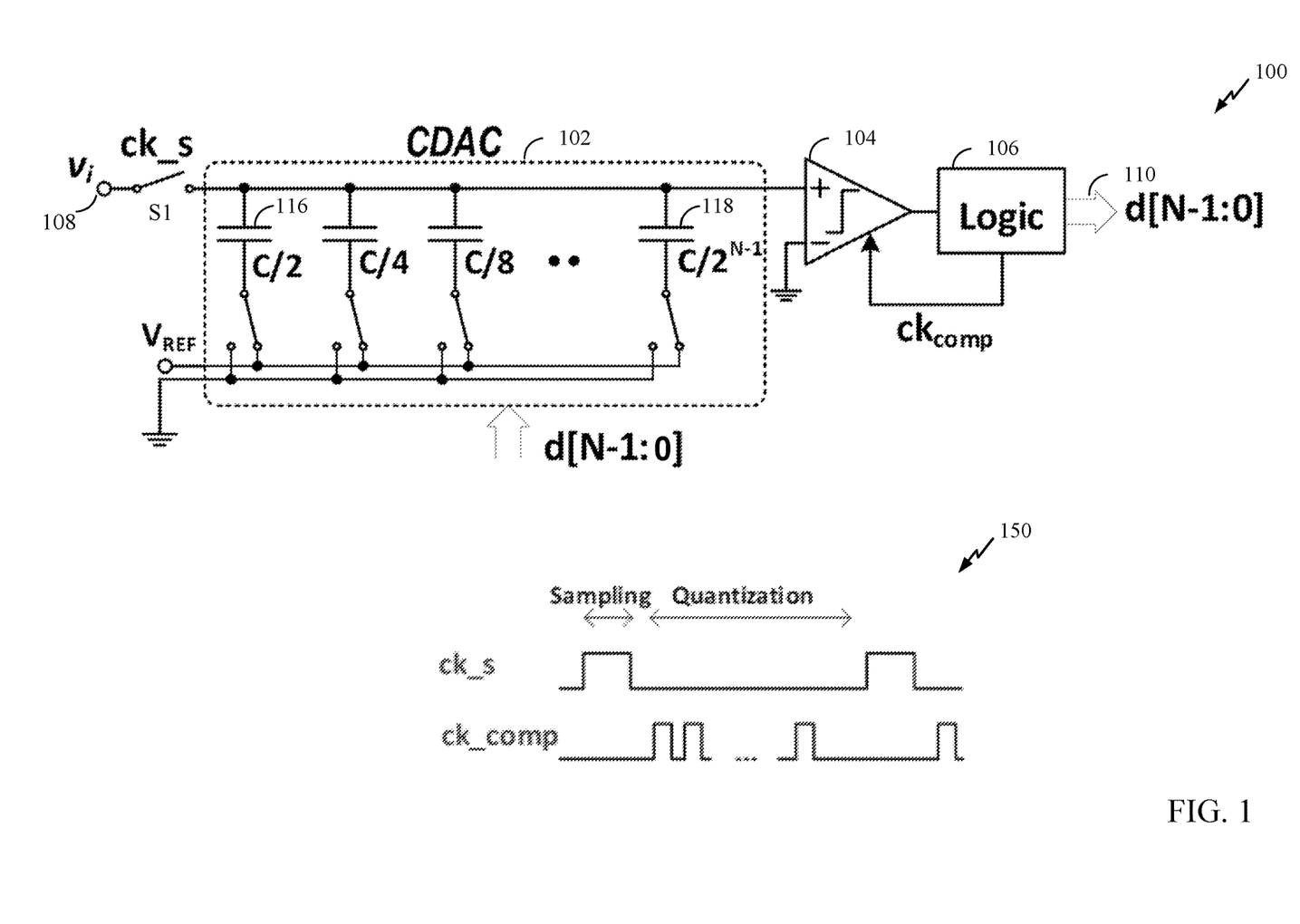
FIG. 1 is a block diagram of an example successive approximation register (SAR) analog-to-digital converter (ADC) circuit, in which aspects of the present disclosure may be practiced, and a corresponding timing diagram.

FIG. 1 is a block diagram of an example SAR ADC circuit 100 and a corresponding timing diagram 150. As illustrated in FIG. 1, the SAR ADC circuit 100 is implemented as a charge-redistribution successive-approximation ADC, and as such, includes a capacitive digital-to-analog converter (CDAC) 102 (also referred to as a "charge-scaling DAC"). The CDAC 102 may include a switched array of binary-weighted capacitors, as shown. For example, capacitor 116 may be the most significant bit (MSB) capacitor, whereas capacitor 118 may be the least significant bit (LSB) capacitor. In addition to the CDAC 102, the SAR ADC circuit 100 includes a sample-and-hold switch S1, a comparator 104, and SAR logic 106. The switch S1 may be coupled between an input node 108 of the SAR ADC circuit 100 and an output of the CDAC 102, which is also coupled to the positive input of the comparator 104. The negative input of the comparator 104 may be coupled to a reference potential node (e.g., electrical ground) of the SAR ADC circuit 100, and the output of the comparator 104 may be coupled to an input of the SAR logic 106. The SAR logic 106 may have an output 110 reflecting the digital signal during quantization (e.g., during the binary search process) and the final digital signal at the end of quantization. The output 110 may be fed back to the input of the CDAC 102, as illustrated in FIG. 1. The analog input signal (labeled "$v_i$") is provided to the input node 108, and the digital output signal (with N bits labeled "d[N−1:0]") is available at the output 110 of the SAR logic 106.

As illustrated in the timing diagram 150, the operation of the sample-and-hold switch S1 may be controlled by a sampling clock signal (labeled "ck_s"), which samples the analog input signal ($v_i$) at the sampling rate ($f_s$, also referred to as the "sampling frequency") of the SAR ADC circuit 100. The comparator 104 may be controlled by a comparator clock (labeled "$ck_{comp}$" and also referred to as "a quantization clock"), which may be provided by the SAR logic 106, as shown. During the conversion process, a SAR ADC with a nominal resolution of N bits may make N comparisons with the comparator 104 and generate a digital output signal with N bits. Thus, the comparator clock ($ck_{comp}$) may have N pulses during each quantization interval.

Example Signal Conversion by a SAR ADC

As described above, a SAR ADC may use a digital-to-analog converter (DAC), a comparator, and logic to convert an analog input signal (a continuous waveform) into a digital output signal (a discrete-time representation). A SAR ADC may use a binary search through different quantization levels (e.g., different DAC steps) before converging upon the final digital signal for outputting from the SAR ADC. For a SAR ADC with a nominal resolution of N bits, the binary search may involve performing N comparisons between an input voltage ($V_{in}$) and a defined threshold.

Figure 2:
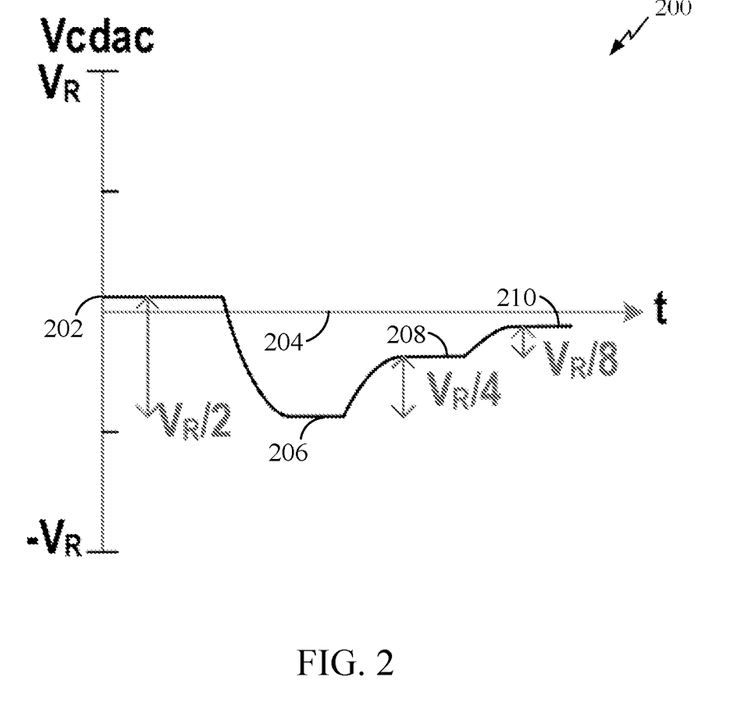
FIG. 2 provides a graph illustrating the voltage ($V_{cdac}$) at an output of a capacitive digital-to-analog converter (CDAC) in a SAR ADC circuit during example signal conversion operations.

FIG. 2 provides a graph 200 illustrating the voltage ($V_{cdac}$) at an output of a SAR ADC circuit during example signal conversion operations. The reference voltage $V_R$ utilized in the binary search may correspond to the input voltage range of the SAR ADC, where the full-scale range is $2V_R$. The binary search begins with a sampled SAR ADC input voltage $V_{in}$ (e.g., at 202) at the CDAC (e.g., CDAC 102). Then, the SAR ADC performs a first comparison with the comparator (e.g., comparator 104). The SAR ADC input voltage $V_{in}$ is compared to a defined threshold (e.g., at 204 of 0 V). The threshold may be set by the negative input of the comparator. In the example of FIG. 2, the threshold is zero. If the input voltage $V_{in}$ is higher than the threshold, the SAR ADC may subtract a value (e.g., a first DAC step of $V_R/2$) from the input voltage $V_{in}$ at the CDAC (e.g., $V_{in}-V_R/2$) to generate a new $V_{cdac}$ (e.g., at 206). In certain cases, like the example illustrated in FIG. 2, the value subtracted from the input voltage $V_{in}$ may be one-half of the reference voltage $V_R$ ($V_R/2$), which may be set by a nominal capacitance of one-half the total capacitance (C/2) in the CDAC's switched array of capacitors (as shown in the CDAC 102 of FIG. 1).

Subsequently, the SAR ADC performs a second comparison. The new $V_{cdac}$ at 206 is compared to the threshold (e.g., at 204). If $V_{cdac}$ at 206 is smaller than the threshold, the SAR ADC may add a value (e.g., a second DAC step of $V_R/4$) to the $V_{cdac}$ to generate another new $V_{cdac}$ (e.g., at 208). In certain cases, the second DAC step ($V_R/4$) may be one half of the first DAC step ($V_R/2$), which may be set by a nominal capacitance of one-fourth the total capacitance (C/4) in the CDAC's switched array of capacitors (as shown in the CDAC 102 of FIG. 1).

Subsequently, the SAR ADC may perform a third comparison. The $V_{cdac}$ at 208 is again compared to the threshold (e.g., at 204). If $V_{cdac}$ at 208 is smaller than the threshold, the SAR ADC may add a value (e.g., a third DAC step of $V_R/8$) to $V_{cdac}$ to generate another new $V_{cdac}$ (e.g., at 210). In certain cases, the third DAC step ($V_R/8$) may be half of the second DAC step ($V_R/4$), which may be set by a nominal capacitance of one-eighth the total capacitance (C/8) in the CDAC's switched array of capacitors (as shown in the CDAC 102 of FIG. 1).

For a nominal resolution of N bits, a conventional SAR ADC may make N comparisons between $V_{cdac}$ and the threshold with N−1 digital-to-analog conversions, in order to generate N output bits. The DAC steps used in the example of FIG. 2 are $V_R/2$, $V_R/4$, $V_R/8$, and so forth. The DAC steps are independent of the input voltage $V_{in}$. Further, a quantization size of a least significant bit (LSB) of a conventional SAR ADC is generally understood to be the full-scale range of the reference voltage divided by 2 to the power of N ($2V_R/2^N$=LSB). The quantization size of the LSB is generally referred to herein as the "LSB size," which may also be referred to as the resolution, the code size, the weight, the worth, the quantization level, the interval, the distance between adjacent codes, or the LSB voltage size of the SAR ADC. The LSB size for a typical SAR ADC is fixed and is independent of input.

Example Signal Conversion by a SAR ADC with Input-Dependent LSB Size

Figure 3:
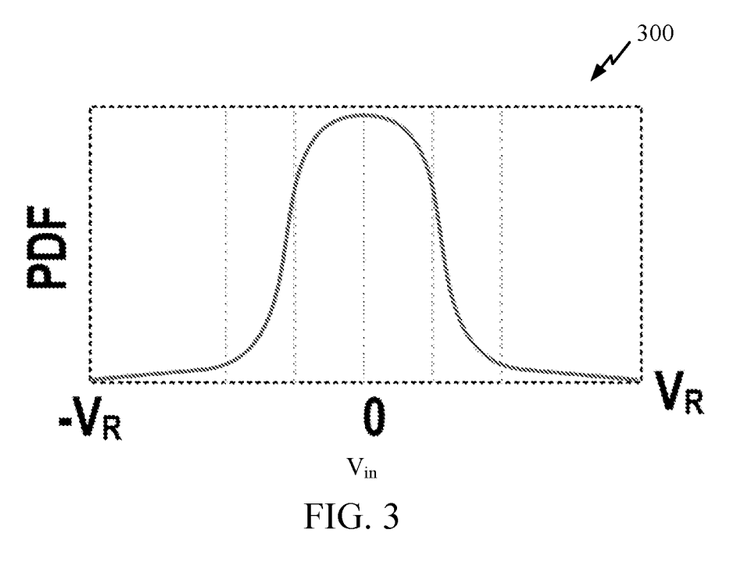
FIG. 3 provides an example probability density function (PDF) of a typical analog input signal.

FIG. 3 provides an example probability density function (PDF) 300 of an analog input signal (e.g., input voltage $V_{in}$). In many systems, the analog input signal is not uniformly distributed across the entire range. Often times, given a range (e.g., from a negative reference voltage $-V_R$ to a positive reference voltage $V_R$), it is more likely that the analog input signal is a small value close to zero, rather than a large value deviating from zero (or another mean). In many systems (e.g., in wireless communications systems), the analog input voltage $V_{in}$ may typically have a normal distribution (i.e., a Gaussian distribution), such as that shown in FIG. 3.

To take advantage of this distribution, certain aspects of the present disclosure provide a SAR ADC configured to convert an analog input signal to a digital output signal, where a quantization size of an LSB associated with the digital output signal is configured to depend on an amplitude of the analog input signal. For certain aspects, a SAR ADC may be configured to operate with a nominal LSB size for a smaller amplitude analog input signal and with a larger LSB size for a larger amplitude analog input signal. For example, if analog input signal $V_{in}$ has a relatively large amplitude, a SAR ADC with variable LSB size may tolerate a larger LSB size and less precision in the analog-to-digital conversion. In another scenario, if the analog input signal $V_{in}$ has a relatively small amplitude, a SAR ADC with variable LSB size may use a smaller LSB size and have more precision.

For certain aspects, a SAR ADC with variable LSB size configured to output N bits may be configured to use a smaller initial quantization level (a DAC step), which results in a total number of comparisons less than N. For certain aspects, the total number of comparisons may be N−1 comparisons, instead of N comparisons. As a result, a SAR ADC with variable LSB size may be able to attain a higher maximum sampling rate because fewer than N comparisons are performed by the SAR ADC. Alternatively, a SAR ADC with variable LSB size may enable lower power dissipation, as the SAR ADC may spend less time overall performing comparisons.

Figure 4A:
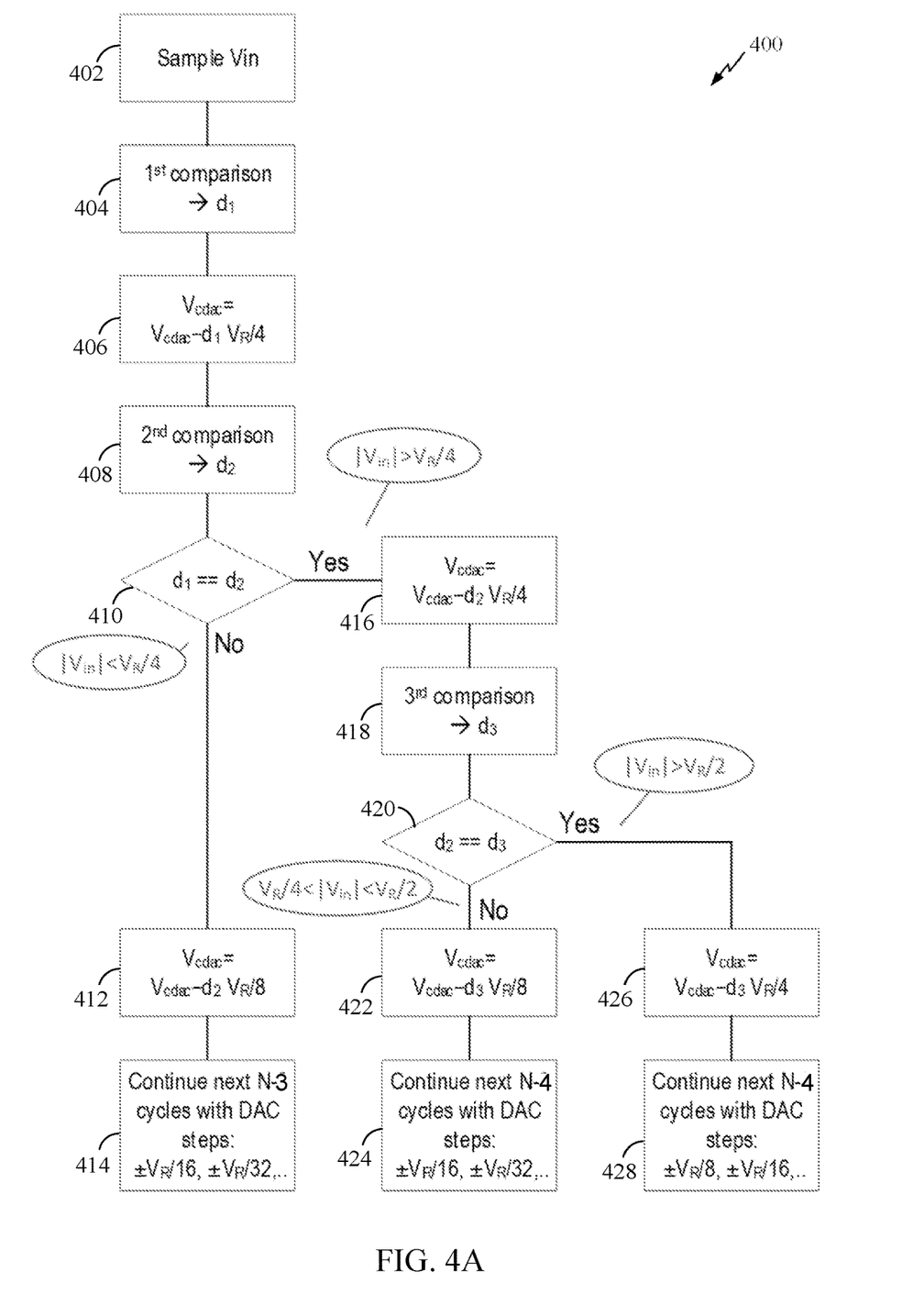
FIG. 4A is a flow diagram illustrating example signal conversion operations for a SAR ADC with an input-dependent least significant bit (LSB) size, in accordance with certain aspects of the present disclosure.
Figure 4B:
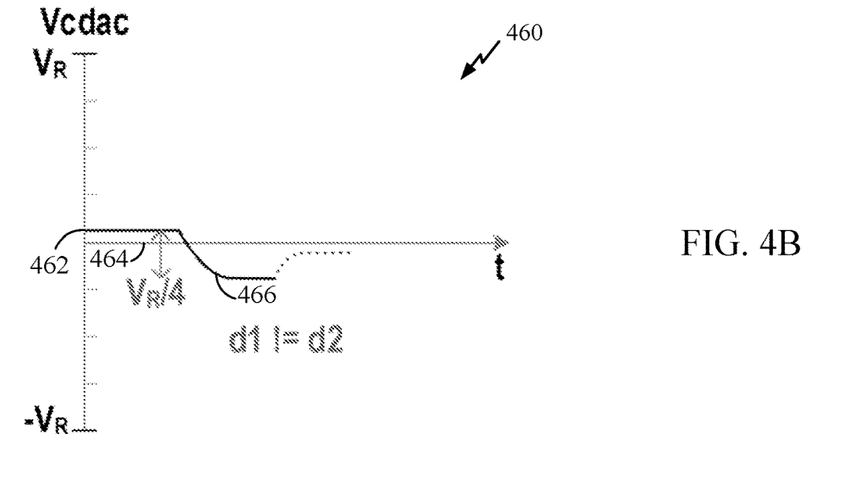
FIGS. 4B-4D provide graphs illustrating the CDAC voltage ($V_{cdac}$) in a SAR ADC with an input-dependent LSB size during the signal conversion operations of FIG. 4A, in accordance with certain aspects of the present disclosure.
Figure 4C:
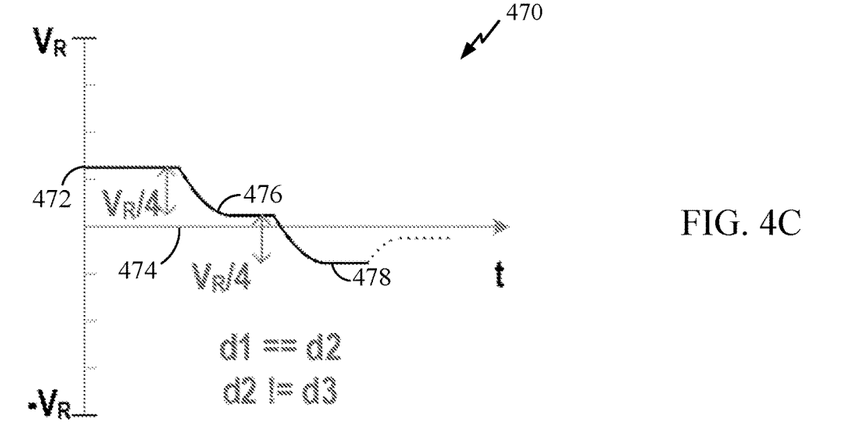
Figure 4D:
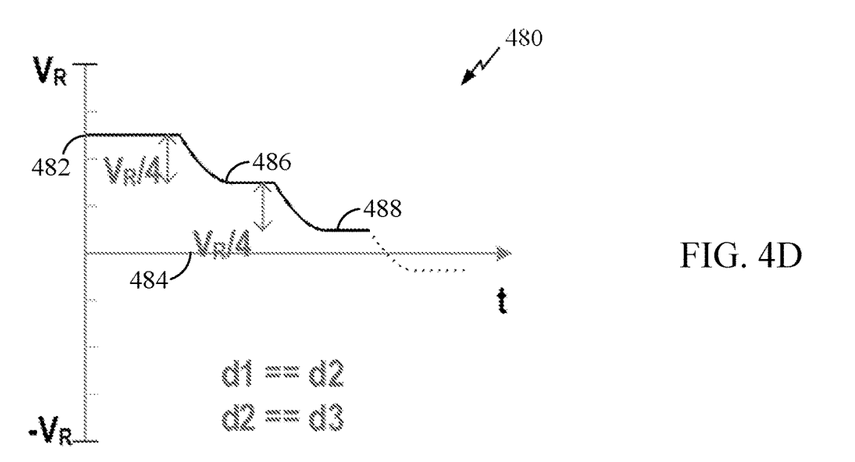

FIG. 4A is a flow diagram illustrating example signal conversion operations 400 for variable LSB size control by a SAR ADC, in accordance with certain aspects of the present disclosure. The operations 400 may be performed by a SAR ADC circuit with input-dependent LSB size (e.g., the SAR ADC circuit 500 of FIG. 5, described below). FIGS. 4B-4D provide example graphs illustrating the $V_{cdac}$ in a SAR ADC with variable LSB size during the signal conversion operations of FIG. 4A, in accordance with certain aspects of the present disclosure. As illustrated in FIGS. 4B-4D, a SAR ADC may be configured to have an input voltage range according to a reference voltage $V_R$, and have a full-scale range of two multiplied by the reference voltage ($2V_R$). The initial DAC step is set less than the initial DAC step of one-half the input voltage range (e.g., $\pm V_R/2$) for a conventional SAR ADC. For the examples in FIGS. 4A-4D, an initial DAC step of $\pm V_R/4$ has been selected for the first comparison. For certain aspects, the selection of the initial DAC step may be dependent upon the desired LSB size, the desired total number of comparisons, the expected distribution of the analog input signal, the ease of implementation, etc. The comparisons and operations performed by the SAR ADC may be controlled by logic (e.g., logic 506, 512).

In the example of FIG. 4B, the operations 400 begin at block 402 of FIG. 4A, with the sample-and-hold switch (e.g., switch S1) of the SAR ADC sampling an analog input voltage $V_{in}$ (e.g., at 462) at the CDAC (e.g., CDAC 502). At block 404, the SAR ADC performs a first comparison between the input voltage $V_{in}$ at the CDAC and the threshold to obtain a first decision $d_1$. In the examples of FIGS. 4B-4D, the threshold is 0 V (e.g., threshold 464 in FIG. 4B). Since input voltage $V_{in}$ is higher than the threshold, the decision $d_1$ is positive. The operations 400 then proceed to block 406, where the SAR ADC may subtract an initial DAC step (e.g., $V_R/4$) from the input voltage $V_{in}$ at the CDAC to generate a new $V_{cdac}$ value. As a result, the new $V_{cdac}$ value becomes $V_{cdac}$ plus $d_1$ multiplied by the initial DAC step ($V_{cdac} - d_1 V_R/4$).

At block 408, the SAR ADC may perform a second comparison between $V_{cdac}$ (e.g., at 466) and the threshold 464 to obtain a second decision $d_2$. Since $V_{cdac}$ is lower than the threshold, the decision $d_2$ is negative.

The operations 400 then proceed to decision block 410, where decision $d_1$ is compared to decision $d_2$. If decisions $d_1$ and $d_2$ are not equal ($d_1 \neq d_2$), as illustrated in FIG. 4B where $V_{cdac}$ is lower than the threshold and the decision $d_2$ is negative, then it is known that the amplitude of the input voltage is less than the initial DAC step ($|V_{in}| < V_R/4$), and the operations 400 proceed to block 412. In this case, the operations 400 may continue with a DAC step (e.g., $\pm V_R/8$) smaller than the selected initial DAC step. At block 412, the SAR ADC may add a value (e.g., a DAC step of $V_R/8$) to $V_{cdac}$ to generate a new $V_{cdac}$ value. As a result, the new $V_{cdac}$ becomes the current $V_{cdac}$ plus $d_2$ multiplied by this DAC step ($V_{cdac} - d_2 V_R/8$).

The operations 400 proceed to block 414, where the operations 400 will continue for the next N−3 cycles with DAC steps $\pm V_R/16$, $\pm V_R/32$, and so on, where N is the number of output bits for the SAR ADC, as described above. Thus, the SAR ADC may make a total of N−1 comparisons for a nominal resolution of N bits, one less comparison than conventional SAR ADCs. In this case (as illustrated in FIG. 4B), because $|V_{in}| < V_R/4$, the SAR ADC with variable LSB size may be configured to operate with an LSB size equal to the nominal LSB size ($LSB_0$) of a conventional SAR ADC with a fixed LSB size (e.g., equal to the full-scale range divided by two to the power of N ($2V_R/2^N$)).

In the example of FIG. 4C, the operations 400 begin at block 402 of FIG. 4A, with a sampled SAR ADC analog input voltage $V_{in}$(e.g., at 472) at the CDAC (e.g., CDAC 502). At block 404, the SAR ADC performs a first comparison between the input voltage $V_{in}$ at the CDAC and the threshold (e.g., 0 V at 474) to obtain a first decision $d_1$. Since the input voltage $V_{in}$ is higher than the threshold, the decision $d_1$ is positive. The operations then proceed to block 406, where the SAR ADC may subtract the initial DAC step (e.g., $\pm V_R/4$) from the input voltage $V_{in}$ at the CDAC to generate a new $V_{cdac}$ value. As a result, the new $V_{cdac}$ becomes the current $V_{cdac}$ plus $d_1$ multiplied by the initial DAC step ($V_{cdac} - d_1 V_R/4$).

At block 408, the SAR ADC performs a second comparison between $V_{cdac}$ (e.g., at 476) and the threshold to obtain a second decision $d_2$. Since $V_{cdac}$ is higher than the threshold, the decision $d_2$ is positive.

The operations 400 then proceed to decision block 410, where decision $d_1$ is compared to decision $d_2$. If decisions $d_1$ and $d_2$ are equal ($d_1 == d_2$) at decision block 410, as illustrated in FIG. 4C, then it is known that the amplitude of the input voltage is greater than the initial DAC step ($|V_{in}| > V_R/4$), and the operations 400 proceed to block 416. In this case, SAR ADC operations may continue with a DAC step equal to the initial DAC step (e.g., another DAC step of $V_R/4$), rather than using a smaller DAC step at this point. At block 416, the SAR ADC may subtract a value (e.g., second DAC step $V_R/4$) from $V_{cdac}$ to generate a new $V_{cdac}$ value (e.g., at 478). As a result, the new $V_{cdac}$ becomes the current $V_{cdac}$ plus $d_2$ multiplied by the second DAC step ($V_{cdac} - d_2 V_R/4$).

At block 418, the SAR ADC may perform a third comparison between $V_{cdac}$ (e.g., at 478) and the threshold (e.g., at 474) to obtain a third decision $d_3$. Since $V_{cdac}$ is lower than the threshold, the decision $d_3$ is negative.

The operations 400 then proceed to decision block 420, where decision $d_2$ is compared to decision $d_3$. If decision $d_2$ and $d_3$ are not equal ($d_2 != d_3$), as illustrated in in FIG. 4C where decision $d_2$ is positive and decision $d_3$ is negative, then the operations 400 proceed to block 422, and it is known that the amplitude of the input voltage is larger than the initial DAC step, but smaller than twice the initial DAC step ($V_R/4 < |V_{in}| < V_R/2$). In this case, the operations may continue with a DAC step (e.g., $\pm V_R/8$) smaller than the initial DAC step.

The operations 400 may proceed to block 422, where the SAR ADC may add a value (e.g., a DAC step of $V_R/8$) to $V_{cdac}$ to generate a new $V_{cdac}$ value. As a result, the new $V_{cdac}$ becomes the current $V_{cdac}$ plus $d_3$ multiplied by the third DAC step ($V_{cdac} - d_3 V_R/8$).

The operations proceed to block 424, where the operations 400 will continue for the next N–4 cycles with DAC steps $\pm V_R/16$, $\pm V_R/32$, and so on. Thus, the SAR ADC may make a total of N–1 comparisons for a nominal resolution of N bits, as described above. In this case (as illustrated in FIG. 4C), when it is known that $V_R/4 < |V_{in}| < V_R/2$, the SAR ADC with variable LSB size may operate with an LSB size equal to twice the nominal LSB size ($2LSB_0$) of a SAR ADC of a conventional SAR ADC with a fixed LSB size. In other words, the $N^{th}$ comparison (e.g., corresponding to a DAC step of $\pm V_R/2N-1$) need not be performed, to keep the total number of comparisons at N–1, and the LSB size increases.

In the example of FIG. 4D, the operations 400 begin at block 402 of FIG. 4A, with a sampled SAR ADC input voltage $V_{in}$(e.g., at 482) at the CDAC (e.g., CDAC 502). At block 404, the SAR ADC performs a first comparison between the input voltage $V_{in}$ at the CDAC and the threshold (e.g., 0 V at 484) to obtain a first decision $d_1$. Since the input voltage $V_{in}$ is higher than the threshold, the decision $d_1$ is positive. The operations 400 then proceed to block 406, where the SAR ADC may subtract the initial DAC step (e.g., $\pm V_R/4$) from the input voltage $V_{in}$ at the CDAC to generate a new $V_{cdac}$ value. As a result, the new $V_{cdac}$ (e.g., at 486) becomes the current $V_{cdac}$ plus $d_1$ multiplied by the initial DAC step ($V_{cdac} - d_1 V_R/4$).

At block 408, the SAR ADC performs a second comparison between $V_{cdac}$ (e.g., at 486) and the threshold to obtain a second decision $d_2$. Since $V_{cdac}$ is higher than the threshold, the decision $d_2$ is positive.

The operations then proceed to decision block 410, where decision $d_1$ is compared to decision $d_2$. If decisions $d_1$ and $d_2$ are equal ($d_1 == d_2$) at decision block 410, as illustrated in FIG. 4D, then it is known that the amplitude of the input voltage is greater than the initial DAC step ($|V_{in}| > V_R/4$), and the operations 400 proceed to block 416. In this case, SAR ADC operations may continue with a DAC step equal to the initial DAC step (e.g., another DAC step of $V_R/4$), rather than using a smaller DAC step at this point. At block 416, the SAR ADC may subtract a value (e.g., second DAC step $V_R/4$) from $V_{cdac}$ to generate a new $V_{cdac}$ value (e.g., at 488). As a result, the new $V_{cdac}$ becomes the current $V_{cdac}$ plus $d_2$ multiplied by the second DAC step ($V_{cdac} - d_2 V_R/4$).

At block 418, the SAR ADC may perform a third comparison between $V_{cdac}$ (e.g., at 488) and the threshold (e.g., at 484) to obtain a third decision $d_3$. Since $V_{cdac}$ is higher than the threshold, the decision $d_3$ is positive once again.

The operations 400 then proceed to decision block 420, where decision $d_2$ is compared to decision $d_3$. If decisions $d_2$ and $d_3$ are equal ($d_2 == d_3$), as illustrated in FIG. 4D where decisions $d_2$ and $d_3$ are both positive, then it is known that the amplitude of the input voltage is larger than twice the initial DAC step ($|V_{in}| > V_R/2$), and the operations 400 proceed to block 426. In this case, SAR ADC operations may continue with another DAC step equal to the initial DAC step (e.g., yet another DAC step of $\pm V_R/4$), rather than using a smaller DAC step at this stage.

At block 426, the SAR ADC may subtract a value (e.g., a third DAC step of $V_R/4$) to $V_{cdac}$ to generate a new $V_{cdac}$ value. As a result, the new $V_{cdac}$ becomes the current $V_{cdac}$ plus $d_3$ multiplied by the third DAC step ($V_{cdac} - d_3 V_R/4$).

The operations 400 proceed to block 428, where the operations 400 will continue for the next N–4 cycles with DAC steps $\pm V_R/8$, $\pm V_R/16$, and so on. Thus, the SAR ADC may make a total of N–1 comparisons for a nominal resolution of N bits, as described above. In this scenario (as illustrated in FIG. 4D), when it is known that $|V_{in}| > V_R/2$, the SAR ADC with variable LSB size may operate with an LSB size equal to four times the nominal LSB size ($4LSB_0$) of a conventional SAR ADC with a fixed LSB size. The last two comparisons for a conventional SAR ADC (with their accompanying DAC steps of $V_R/2N^{-2}$ and $\pm V_R/2N-1$) need not be performed, to keep the total number of comparisons at N–1, and the LSB size increases (e.g., to $4LSB_0$).

Although the operations 400 of FIG. 4A use an initial DAC step of $\pm V_R/4$ with input-dependent LSB sizes that are binary multiples of the nominal LSB size (e.g., $LSB_0$, $2LSB_0$, and $4LSB_0$), it is to be understood that other initial DAC steps and/or other variable LSB sizes may be utilized. For example, an initial DAC step of $V_R/3$ may be used, where the variable LSB sizes are proportional to the nominal LSB size. As described above, the selection of the initial DAC step may be dependent upon the desired LSB size, the desired total number of comparisons, the expected distribution of the analog input signal, the ease of implementation, etc. A smaller initial DAC step may result in a smaller number of SAR cycles for quantizing a smaller input (which may be desirable), but a larger LSB size for larger inputs (which may be undesirable). To help with this tradeoff, for certain aspects, the SAR ADC may be allowed to continue for one or more extra cycles when the input signal is large, in order to bring the LSB size down to an acceptable level.

For certain aspects, the SAR ADC may be reconfigurable such that the SAR ADC is configured to operate in a first mode where the quantization size of the LSB is configured to depend on the amplitude of the analog input signal and to operate in a second mode where the quantization size of the LSB is fixed and independent of the amplitude of the analog input signal. The configuration of the SAR ADC may be adaptable for certain system requirements.

Example SAR ADC with an Input-Dependent LSB Size

Figure 5:
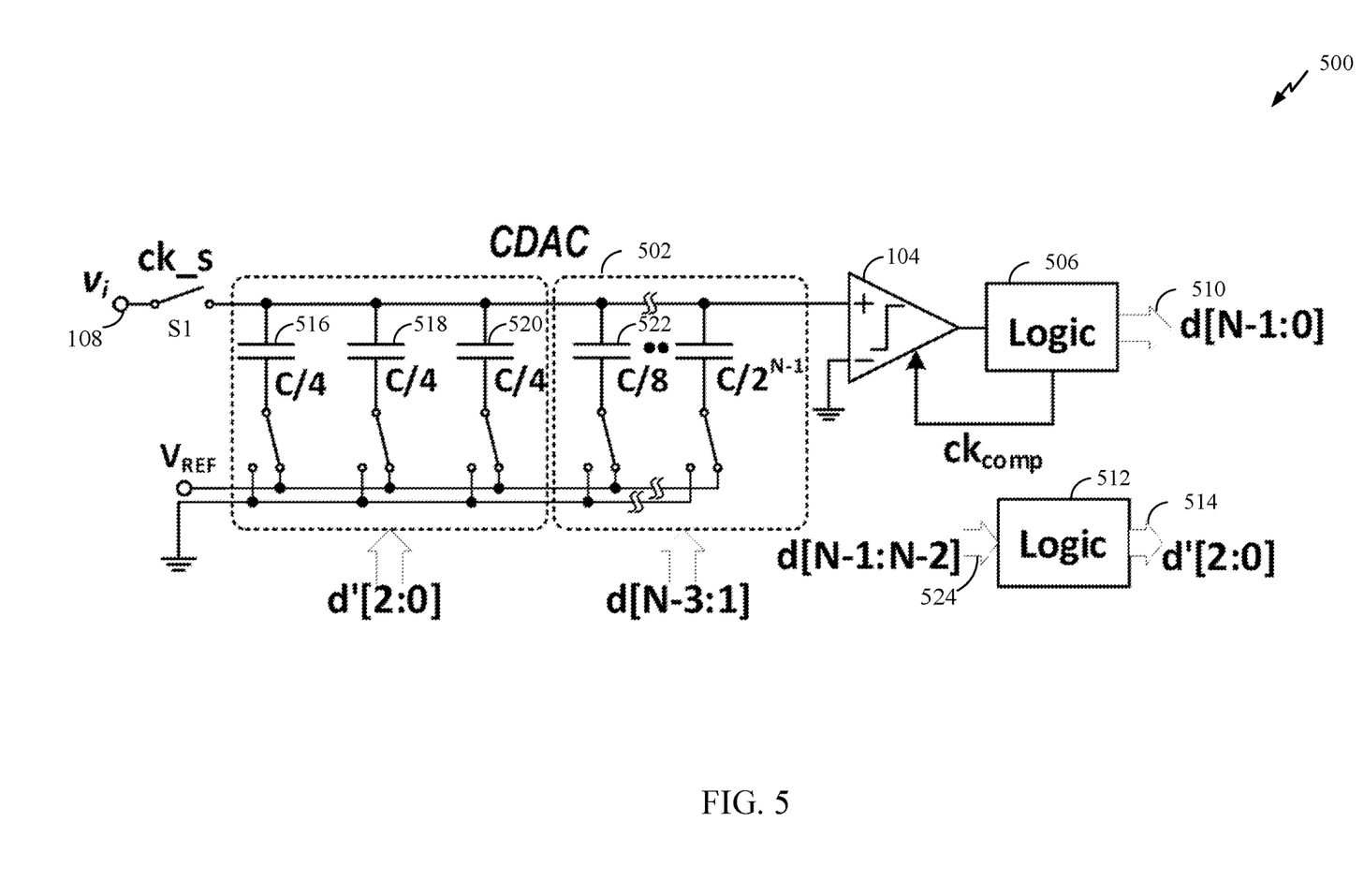
FIG. 5 is a block diagram of an example SAR ADC circuit with a variable LSB size, in accordance with certain aspects of the present disclosure.

FIG. 5 is a block diagram of an example SAR ADC circuit 500 with variable LSB size, in accordance with certain aspects of the present disclosure. The SAR ADC circuit 500 may be similar to the SAR ADC circuit 100 of FIG. 1, and may include a sample-and-hold switch S1, a CDAC 502, a comparator 104, and SAR logic 506. In addition, the SAR ADC circuit 500 may optionally include other logic 512. In this case, an output 510 of the logic 506 may become an input 524 to the logic 512. For other aspects, the logic 512 may be internalized in the logic 506.

The CDAC 502 of the SAR ADC circuit 500 may include an array of switched capacitors (having a total capacitance C), and an input of the comparator 104 may be coupled to the output of the CDAC 502. For certain aspects, the array of switched capacitors may include two or more most significant bit (MSB) capacitors, which may have non-binary weighting (e.g., have the same value). For example, the array of switched capacitors may include three most significant bit (MSB) capacitors (e.g., capacitors 516, 518, 520) with a value of one-fourth a total capacitance (C/4), as shown in FIG. 5. The logic 506 of the SAR ADC circuit 500 may have an output 510 with N bits for the digital output signal (labeled "d[N–1:0]"). The logic 512 (or logic 506) may have another output 514 with two or more bits for controlling the two or more MSB capacitors (according to the two or more MSBs of the digital output signal). In the case of three MSB capacitors as shown in FIG. 5, the three MSBs of the digital output signal are labeled "d'[2:0]."

During operation of the SAR ADC circuit 500, the first comparison performed by the CDAC 502 may result in the first MSB in the output signal of the logic, which also determines the position of the CDAC switch associated with a first capacitor 516. Subsequently, the logic may determine, based on the first comparison (and the resulting MSB of the digital output signal), which capacitor and associated switch in the array of switched capacitors to activate. For example, the logic may determine whether the next DAC step is $\pm V_R/4$ (meaning that the switch associated with a second capacitor 518 with capacitance C/4 may be activated) or $V_R/8$ (meaning that the switch of a fourth capacitor 522 with capacitance C/8 may be activated). As explained in relation to FIGS. 4A-4D, if it is determined that $|V_{in}|>V_R/4$, then the CDAC 502 may use a second DAC step (e.g., $\pm V_R/4$) that is equal to the first DAC step. On the other hand, if it is determined that $|V_{in}|<V_R/4$, then the CDAC 502 may use a second DAC step (e.g., $\pm V_R/8$) smaller than the first DAC step. The remaining capacitors in the array of switched capacitors may be configured to be controlled by at least a portion of the remaining bits of the digital output signal.

After the second comparison is made, the logic may determine, based on the first and second comparisons (and the resulting two MSBs of the digital output signal), which capacitor and associated switch in the array of switched capacitors to activate. For example, the logic may determine whether the next DAC step is $\pm V_R/4$ (meaning that the switch of a third capacitor 520 with capacitance C/4 may be activated) or $V_R/8$ (meaning that the switch of the fourth capacitor 522 may be activated). As explained in relation to FIGS. 4A-4D, if it is determined that $|V_{in}|>V_R/2$, then the CDAC 502 may use a third DAC step (e.g., $\pm V_R/4$) that is equal to the first DAC step. On the other hand, if it is determined that $V_R/4<|V_{in}|<V_R/2$, then the CDAC 502 may use a third DAC step (e.g., $\pm V_R/8$) smaller than the second DAC step.

Example Signal Conversion Operations

Figure 6:
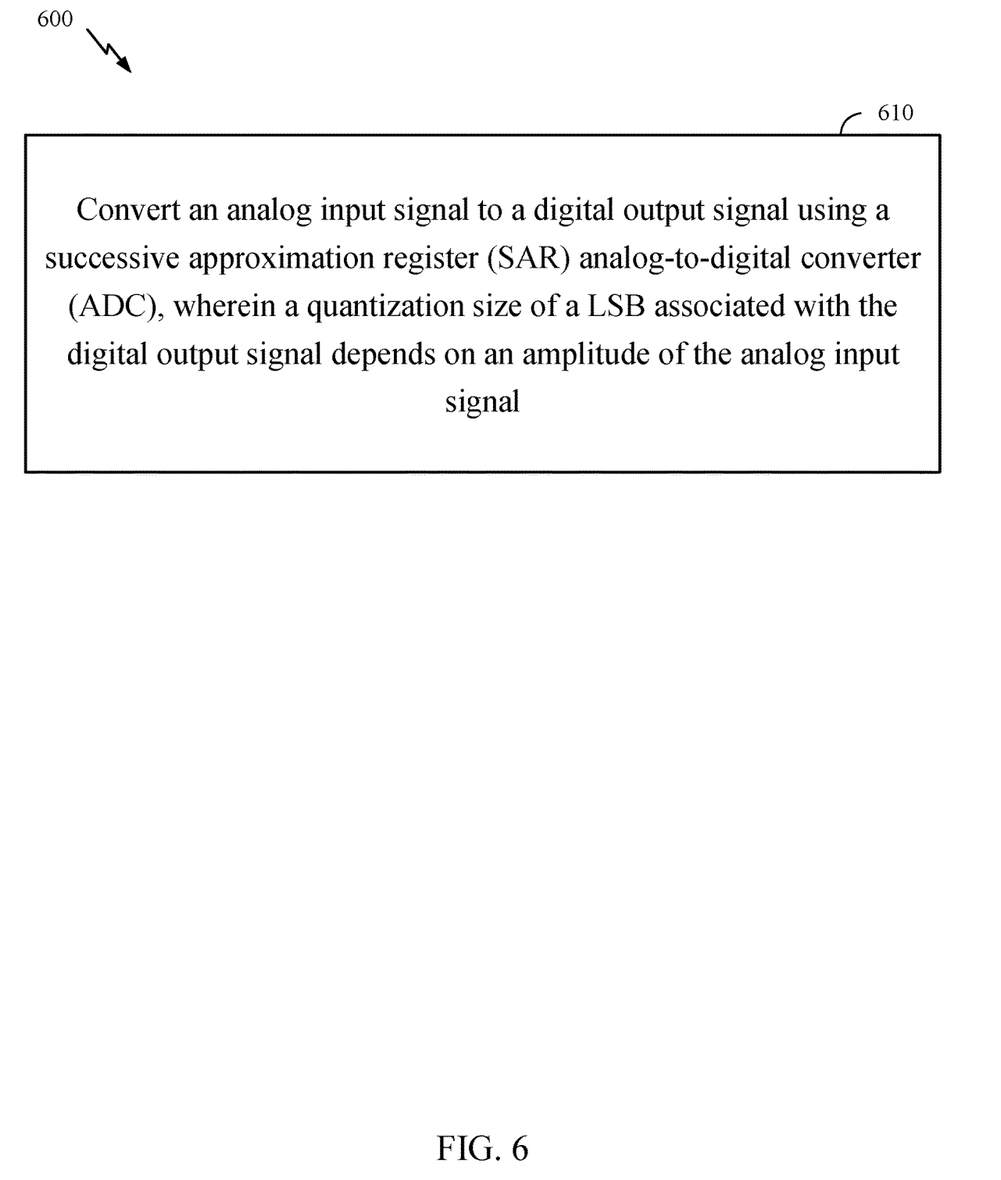
FIG. 6 is a flow diagram depicting example operations for signal conversion, in accordance with certain aspects of the present disclosure.

FIG. 6 is a flow diagram depicting example operations 600 for signal conversion, in accordance with certain aspects of the present disclosure. The operations 600 may be performed by a successive approximation register (SAR) analog-to-digital converter (ADC) (e.g., the SAR ADC circuit 500 of FIG. 5).

The operations 600 may generally include, at block 610, the SAR ADC converting an analog input signal (e.g., signal $v_i$) to a digital output. A quantization size of a least significant bit (LSB) associated with the digital output signal may depend on an amplitude of the analog input signal.

According to certain aspects, during operations 600, the SAR ADC may be configured to output N bits, and the converting at block 610 may include making less than N comparisons (e.g., with a comparator, such as comparator 104) to generate the N bits. For certain aspects, the converting at block 610 may include making only N–1 comparisons to generate the N bits.

According to certain aspects, the converting at block 610 may include operating the SAR ADC with a nominal LSB size ($LSB_0$) for a smaller amplitude of the analog input signal and with a larger LSB size (e.g., $2LSB_0$) for a larger amplitude of the analog input signal.

According to certain aspects, the SAR ADC may be configured such that if the amplitude of the analog input signal is less than a first threshold, the converting at block 610 involves the SAR ADC operating with a first LSB size (e.g., $LSB_0$). For certain aspects, the SAR ADC may be configured such that if the amplitude of the analog input signal is greater than the first threshold, the converting at block 610 involves the SAR ADC operating with a second LSB size (e.g., $2LSB_0$) that is greater than the first LSB size. For certain aspects, the converting at block 610 may include the SAR ADC outputting N bits, and the SAR ADC may have an input voltage range of $V_R$ and a full-scale range of $2V_R$. In certain aspects, the first LSB size may be a nominal LSB size ($LSB_0$) for the SAR ADC equal to the full-scale range divided by two to the power of N ($2V_R/2^N$).

For certain aspects, the first threshold is one-fourth the input voltage range ($V_R/4$). For example, if the amplitude of $V_{in}$ is known to be smaller than $V_R/4$ ($|V_{in}|<V_R/4$), a SAR ADC circuit may be configured to operate with an LSB size equal to the nominal LSB size ($LSB_0$) of the SAR ADC. As another example, when the amplitude of $V_{in}$ is larger than $V_R/4$ and smaller than $V_R/2$ ($V_R/4<|V_{in}|<V_R/2$), the SAR ADC may be configured to operate with an LSB size equal to twice the nominal LSB size ($2LSB_0$).

According to certain aspects, if the amplitude of the analog input signal is greater than the first threshold and less than a second threshold, the converting at block 610 involves the SAR ADC operating with the second LSB size. For certain aspects, if the amplitude of the analog input signal is greater than the second threshold, the converting at block 610 involves the SAR ADC operating with a third LSB size (e.g., $4LSB_0$) that is greater than the second LSB size. For example, when the amplitude of $V_{in}$ is larger than $V_R/2$ ($|V_{in}|>V_R/2$), the SAR ADC may have an LSB size equal to four times the nominal LSB size ($4LSB_0$).

According to certain aspects, the SAR ADC may include a digital-to-analog converter (DAC) (e.g., a CDAC 502) and may be configured to have an input voltage range of $V_R$ and a full-scale range of $2V_R$. In this case, the converting at block 610 may involve the SAR ADC not using a DAC step of one-half the input voltage range ($V_R/2$). For certain aspects, the converting at block 610 may include the SAR ADC using an initial DAC step with a voltage less than one-half the input voltage range ($<V_R/2$). For example, the converting at block 610 may involve the SAR ADC using an initial DAC step of one-fourth the input voltage range ($V_R/4$).

Example Aspects

Implementation examples are described in the following numbered aspects:

Aspect 1: A successive approximation register (SAR) analog-to-digital converter (ADC) configured to convert an analog input signal to a digital output signal, wherein a quantization size of a least significant bit (LSB) associated with the digital output signal is configured to depend on an amplitude of the analog input signal.

Aspect 2: The SAR ADC of Aspect 1, wherein the SAR ADC is configured to output N bits and wherein the SAR ADC is configured to convert the analog input signal to the digital output signal using less than N comparisons.

Aspect 3: The SAR ADC of Aspect 1 or 2, wherein the SAR ADC is configured to output N bits and wherein the SAR ADC is configured to convert the analog input signal to the digital output signal using only N−1 comparisons.

Aspect 4: The SAR ADC of any of the preceding Aspects, wherein the SAR ADC is configured to operate with a nominal LSB size for a smaller amplitude of the analog input signal and with a larger LSB size for a larger amplitude of the analog input signal.

Aspect 5: The SAR ADC of any of Aspects 1-3, wherein if the amplitude of the analog input signal is less than a first threshold, the SAR ADC is configured to operate with a first LSB size and wherein if the amplitude of the analog input signal is greater than the first threshold, the SAR ADC is configured to operate with a second LSB size that is greater than the first LSB size.

Aspect 6: The SAR ADC of Aspect 5, wherein the SAR ADC is configured to output N bits, to have an input voltage range of $V_R$, and to have a full-scale range of $2V_R$ and wherein the first LSB size is a nominal LSB size for the SAR ADC equal to the full-scale range divided by two to the power of N($2V_R/2^N$).

Aspect 7: The SAR ADC of Aspect 6, wherein the first threshold is one-fourth the input voltage range ($V_R/4$).

Aspect 8: The SAR ADC of any of Aspects 5-7, wherein if the amplitude of the analog input signal is greater than the first threshold and less than a second threshold, the SAR ADC is configured to operate with the second LSB size and wherein if the amplitude of the analog input signal is greater than the second threshold, the SAR ADC is configured to operate with a third LSB size that is greater than the second LSB size.

Aspect 9: The SAR ADC of any of the preceding Aspects, wherein the SAR ADC comprises a digital-to-analog converter (DAC) and is configured to have an input voltage range of $V_R$, to have a full-scale range of $2V_R$, and to not use a DAC step of one-half the input voltage range ($V_R/2$).

Aspect 10: The SAR ADC of Aspect 9, wherein the SAR ADC is configured to use an initial DAC step with a voltage less than one-half the input voltage range ($V_R/2$).

Aspect 11: The SAR ADC of Aspect 9 or 10, wherein the SAR ADC is configured to use an initial DAC step of one-fourth the input voltage range ($V_R/4$).

Aspect 12: The SAR ADC of Aspect 11, further comprising: a comparator having an input coupled to an output of the DAC; and logic having an input coupled to an output of the comparator, wherein: the DAC is a capacitive digital-to-analog converter (CDAC) comprising an array of switched capacitors; three most significant bit (MSB) capacitors in the array of switched capacitors have a value of one-fourth a total capacitance (C/4); the logic has a first output with N bits for the digital output signal; the logic has a second output with three bits for controlling the three MSB capacitors based on two MSBs of the digital output signal; and remaining capacitors in the array of switched capacitors are controlled by at least a portion of remaining bits of the digital output signal.

Aspect 13: The SAR ADC of any of Aspects 1-11, wherein the SAR ADC comprises: a capacitive digital-to-analog converter (CDAC) comprising an array of switched capacitors; a comparator having an input coupled to an output of the CDAC; and logic having an input coupled to an output of the comparator, wherein: two or more most significant bit (MSB) capacitors in the array of switched capacitors have non-binary weighting; the logic has a first output with N bits for the digital output signal; the logic has a second output with two or more bits for controlling the two or more MSB capacitors based on one or more MSBs of the digital output signal; and remaining capacitors in the array of switched capacitors are configured to be controlled by at least a portion of remaining bits of the digital output signal.

Aspect 14: The SAR ADC of Aspect 13, wherein the two or more MSB capacitors in the array of switched capacitors have a same value.

Aspect 15: The SAR ADC of any of the preceding Aspects, wherein the SAR ADC is reconfigurable such that the SAR ADC is configured to operate in a first mode where the quantization size of the LSB is configured to depend on the amplitude of the analog input signal and to operate in a second mode where the quantization size of the LSB is fixed and independent of the amplitude of the analog input signal.

Aspect 16: A successive approximation register (SAR) analog-to-digital converter (ADC) comprising: a capacitive digital-to-analog converter (CDAC) comprising an array of switched capacitors; a comparator having an input coupled to an output of the CDAC; and logic having an input coupled to an output of the comparator, wherein: two or more most significant bit (MSB) capacitors in the array of switched capacitors have non-binary weighting; the logic has a first output with N bits for a digital output signal; the logic has a second output with two or more bits for controlling the two or more MSB capacitors based on one or more MSBs of the digital output signal; and remaining capacitors in the array of switched capacitors are configured to be controlled by at least a portion of remaining bits of the digital output signal.

Aspect 17: The SAR ADC of Aspect 16, wherein the SAR ADC is configured to convert an analog input signal to the digital output signal using less than N comparisons.

Aspect 18: The SAR ADC of Aspect 16 or 17, wherein the two or more MSB capacitors in the array of switched capacitors have a same value.

Aspect 19: A method of signal conversion, the method comprising converting an analog input signal to a digital output signal using a successive approximation register (SAR) analog-to-digital converter (ADC), wherein a quantization size of a least significant bit (LSB) associated with the digital output signal depends on an amplitude of the analog input signal.

Aspect 20: The method of Aspect 19, wherein the SAR ADC is configured to output N bits and wherein the converting comprises making less than N comparisons to generate the N bits.

Aspect 21: The method of Aspect 19 or 20, wherein the SAR ADC is configured to output N bits and wherein the converting comprises making only N–1 comparisons to generate the N bits.

Aspect 22: The method of any of Aspects 19-21, wherein the converting comprises operating the SAR ADC with a nominal LSB size for a smaller amplitude of the analog input signal and with a larger LSB size for a larger amplitude of the analog input signal.

Aspect 23: The method of any of Aspects 19-21, wherein if the amplitude of the analog input signal is less than a first threshold, the converting comprises the SAR ADC operating with a first LSB size and wherein if the amplitude of the analog input signal is greater than the first threshold, the converting comprises the SAR ADC operating with a second LSB size that is greater than the first LSB size.

Aspect 24: The method of Aspect 23, wherein the converting comprises the SAR ADC outputting N bits, wherein the SAR ADC has an input voltage range of $V_R$ and has a full-scale range of $2V_R$, and wherein the first LSB size is a nominal LSB size for the SAR ADC equal to the full-scale range divided by two to the power of N ($2V_R/2^N$).

Aspect 25: The method of Aspect 24, wherein the first threshold is one-fourth the input voltage range ($V_R/4$).

Aspect 26: The method of any of Aspects 23-25, wherein if the amplitude of the analog input signal is greater than the first threshold and less than a second threshold, the converting comprises the SAR ADC operating with the second LSB size and wherein if the amplitude of the analog input signal is greater than the second threshold, the converting comprises the SAR ADC operating with a third LSB size that is greater than the second LSB size.

Aspect 27: The method of any of Aspects 19-26, wherein the SAR ADC comprises a digital-to-analog converter (DAC) and is configured to have an input voltage range of $V_R$ and a full-scale range of $2V_R$ and wherein the converting comprises the SAR ADC not using a DAC step of one-half the input voltage range ($V_R/2$).

Aspect 28: The method of Aspect 27, wherein the converting comprises the SAR ADC using an initial DAC step with a voltage less than one-half the input voltage range ($V_R/2$).

Aspect 29: The method of Aspect 27 or 28, wherein the converting comprises the SAR ADC using an initial DAC step of one-fourth the input voltage range ($V_R/4$).

Additional Considerations

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more."

Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes, and variations may be made in the arrangement, operation, and details of the methods and apparatus described above without departing from the scope of the claims.

The invention claimed is:

1. A successive approximation register (SAR) analog-to-digital converter (ADC) configured to convert an analog input signal to a digital output signal, wherein a quantization size of a least significant bit (LSB) associated with the digital output signal is configured to depend on an amplitude of the analog input signal, wherein the SAR ADC is configured to output N bits, and wherein the SAR ADC is configured to convert the analog input signal to the digital output signal using less than N comparisons.

2. The SAR ADC of claim 1, wherein the SAR ADC is configured to convert the analog input signal to the digital output signal using only N−1 comparisons.

3. The SAR ADC of claim 1, wherein the SAR ADC is configured to operate with a nominal LSB size for a smaller amplitude of the analog input signal and with a larger LSB size for a larger amplitude of the analog input signal.

4. The SAR ADC of claim 1, wherein if the amplitude of the analog input signal is less than a first threshold, the SAR ADC is configured to operate with a first LSB size and wherein if the amplitude of the analog input signal is greater than the first threshold, the SAR ADC is configured to operate with a second LSB size that is greater than the first LSB size.

5. The SAR ADC of claim 4, wherein the SAR ADC is configured to have an input voltage range of $V_R$ and to have a full-scale range of $2V_R$ and wherein the first LSB size is a nominal LSB size for the SAR ADC equal to the full-scale range divided by two to the power of $N(2V_R/2^N)$.

6. The SAR ADC of claim 5, wherein the first threshold is one-fourth the input voltage range ($V_R/4$).

7. The SAR ADC of claim 4, wherein if the amplitude of the analog input signal is greater than the first threshold and less than a second threshold, the SAR ADC is configured to operate with the second LSB size and wherein if the amplitude of the analog input signal is greater than the second threshold, the SAR ADC is configured to operate with a third LSB size that is greater than the second LSB size.

8. The SAR ADC of claim 1, wherein the SAR ADC comprises a digital-to-analog converter (DAC) and is configured to have an input voltage range of $V_R$, to have a full-scale range of $2V_R$, and to not use a DAC step of one-half the input voltage range ($V_R/2$).

9. The SAR ADC of claim 8, wherein the SAR ADC is configured to use an initial DAC step with a voltage less than one-half the input voltage range ($V_R/2$).

10. The SAR ADC of claim 8, wherein the SAR ADC is configured to use an initial DAC step of one-fourth the input voltage range ($V_R/4$).

11. The SAR ADC of claim 10, further comprising:
  a comparator having an input coupled to an output of the DAC; and
  logic having an input coupled to an output of the comparator, wherein:
   the DAC is a capacitive digital-to-analog converter (CDAC) comprising an array of switched capacitors;
   three most significant bit (MSB) capacitors in the array of switched capacitors have a value of one-fourth a total capacitance (C/4);
   the logic has a first output with the N bits for the digital output signal;
   the logic has a second output with three bits for controlling the three MSB capacitors based on two MSBs of the digital output signal; and
   remaining capacitors in the array of switched capacitors are controlled by at least a portion of remaining bits of the digital output signal.

12. The SAR ADC of claim 1, wherein the SAR ADC comprises:
  a capacitive digital-to-analog converter (CDAC) comprising an array of switched capacitors;
  a comparator having an input coupled to an output of the CDAC; and
  logic having an input coupled to an output of the comparator, wherein:
   two or more most significant bit (MSB) capacitors in the array of switched capacitors have non-binary weighting;
   the logic has a first output with the N bits for the digital output signal;
   the logic has a second output with two or more bits for controlling the two or more MSB capacitors based on one or more MSBs of the digital output signal; and
   remaining capacitors in the array of switched capacitors are configured to be controlled by at least a portion of remaining bits of the digital output signal.

13. The SAR ADC of claim 12, wherein the two or more MSB capacitors in the array of switched capacitors have a same value.

14. The SAR ADC of claim 1, wherein the SAR ADC is reconfigurable such that the SAR ADC is configured to operate in a first mode where the quantization size of the LSB is configured to depend on the amplitude of the analog input signal and to operate in a second mode where the quantization size of the LSB is fixed and independent of the amplitude of the analog input signal.

15. A successive approximation register (SAR) analog-to-digital converter (ADC) comprising:
  a capacitive digital-to-analog converter (CDAC) comprising an array of switched capacitors;
  a comparator having an input coupled to an output of the CDAC; and
  logic having an input coupled to an output of the comparator, wherein:
   two or more most significant bit (MSB) capacitors in the array of switched capacitors have non-binary weighting;

the logic has a first output with N bits for a digital output signal;

the logic has a second output with two or more bits for controlling the two or more MSB capacitors based on one or more MSBs of the digital output signal; and remaining capacitors in the array of switched capacitors are configured to be controlled by at least a portion of remaining bits of the digital output signal.

16. The SAR ADC of claim 15, wherein the SAR ADC is configured to convert an analog input signal to the digital output signal using less than N comparisons.

17. The SAR ADC of claim 15, wherein the two or more MSB capacitors in the array of switched capacitors have a same value.

18. A method of signal conversion, the method comprising converting an analog input signal to a digital output signal using a successive approximation register (SAR) analog-to-digital converter (ADC), wherein a quantization size of a least significant bit (LSB) associated with the digital output signal depends on an amplitude of the analog input signal, wherein the SAR ADC is configured to output N bits, and wherein the converting comprises making less than N comparisons to generate the N bits.

19. The method of claim 18, wherein the converting comprises making only N−1 comparisons to generate the N bits.

20. The method of claim 18, wherein the converting comprises operating the SAR ADC with a nominal LSB size for a smaller amplitude of the analog input signal and with a larger LSB size for a larger amplitude of the analog input signal.

21. The method of claim 18, wherein if the amplitude of the analog input signal is less than a first threshold, the converting comprises the SAR ADC operating with a first LSB size and wherein if the amplitude of the analog input signal is greater than the first threshold, the converting comprises the SAR ADC operating with a second LSB size that is greater than the first LSB size.

22. The method of claim 21, wherein the converting comprises the SAR ADC outputting the N bits, wherein the SAR ADC has an input voltage range of $V_R$ and has a full-scale range of $2V_R$, and wherein the first LSB size is a nominal LSB size for the SAR ADC equal to the full-scale range divided by two to the power of $N(2V_R/2^N)$.

23. The method of claim 22, wherein the first threshold is one-fourth the input voltage range ($V_R/4$).

24. The method of claim 21, wherein if the amplitude of the analog input signal is greater than the first threshold and less than a second threshold, the converting comprises the SAR ADC operating with the second LSB size and wherein if the amplitude of the analog input signal is greater than the second threshold, the converting comprises the SAR ADC operating with a third LSB size that is greater than the second LSB size.

25. The method of claim 18, wherein the SAR ADC comprises a digital-to-analog converter (DAC) and is configured to have an input voltage range of $V_R$ and a full-scale range of $2V_R$ and wherein the converting comprises the SAR ADC not using a DAC step of one-half the input voltage range ($V_R/2$).

26. The method of claim 25, wherein the converting comprises the SAR ADC using an initial DAC step with a voltage less than one-half the input voltage range ($V_R/2$).

27. The method of claim 25, wherein the converting comprises the SAR ADC using an initial DAC step of one-fourth the input voltage range ($V_R/4$).

* * * * *